United States Patent [19]

Clayton

[11] Patent Number: 4,661,962
[45] Date of Patent: Apr. 28, 1987

[54] PHASED LINEAR LASER ARRAY

[75] Inventor: Richard D. Clayton, Kanata, Canada

[73] Assignee: Northern Telecom Limited, Montreal, Canada

[21] Appl. No.: 663,424

[22] Filed: Oct. 22, 1984

[51] Int. Cl.⁴ .............................................. H01S 3/19
[52] U.S. Cl. ......................................... 372/50; 372/29
[58] Field of Search ...................... 372/50, 19, 26, 33, 372/29

[56] References Cited

U.S. PATENT DOCUMENTS 4,385,389  5/1983  Botez .................................... 372/50
4,509,173  5/1985  Umeda et al. ......................... 372/50

Primary Examiner—James W. Davie
Attorney, Agent, or Firm—Schwartz, Jeffery, Schwaab, Mack, Blumenthal & Evans

[57] ABSTRACT

A phase-locked linear laser array has an output array in which equispaced optical gain elements are formed along a semiconductor bar and a control laser array having equispaced laser elements in close coupling with the output array. The output array elements, having twice the spacing of the control array elements, are aligned with alternating elements of the control array. The tendency of the control array lasers to operate with 180° optical phase difference between adjacent lasers causes every other laser to be in-phase and thus adjacent elements of the output array are also in-phase.

10 Claims, 1 Drawing Figure

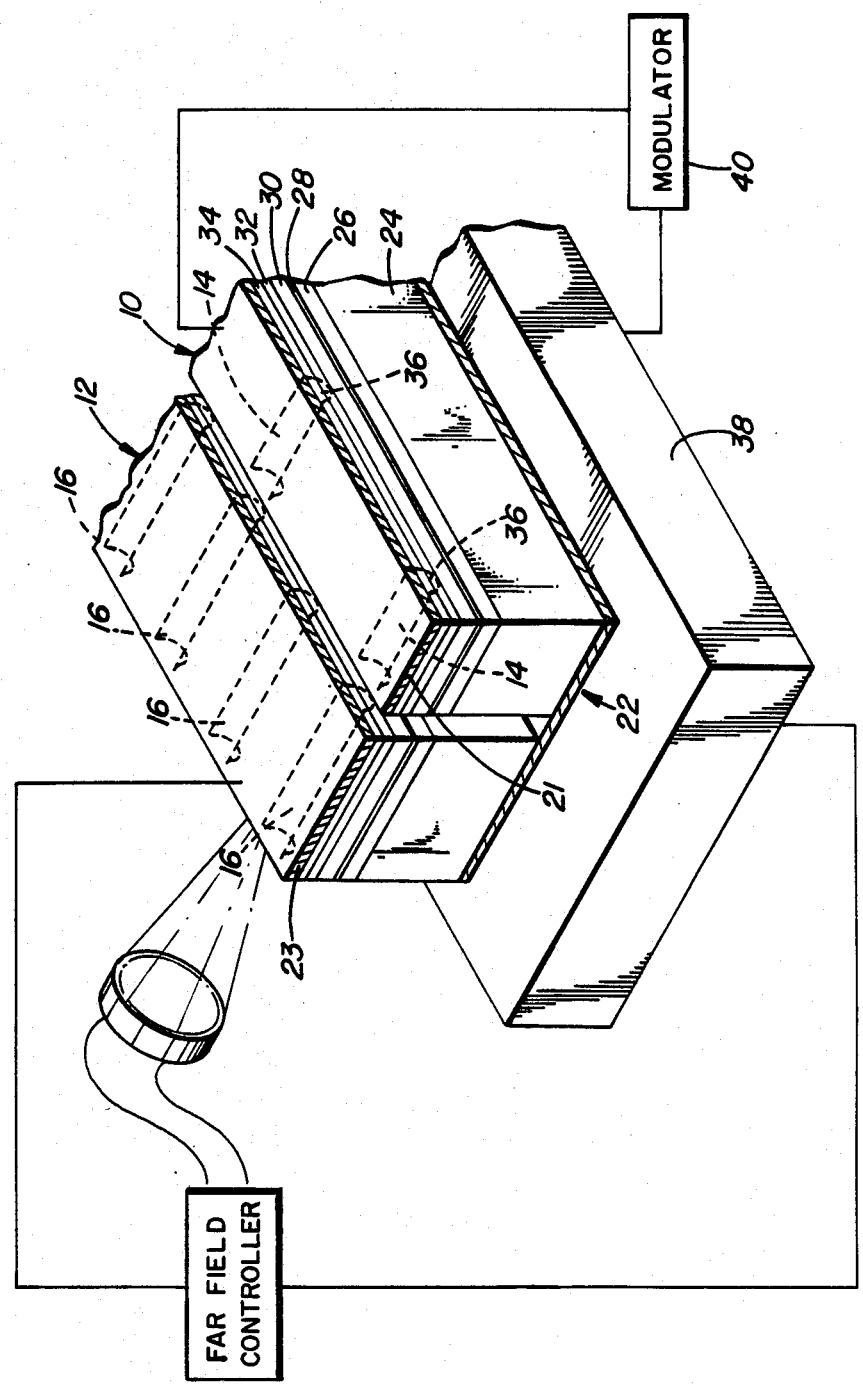

4,661,962

PHASED LINEAR LASER ARRAY

BACKGROUND OF THE INVENTION

This invention relates to phase-locked arrays of semiconductor lasers.

Phase-locked arrays of semiconductor lasers are increasingly finding application in optical recording, optical printing and free-space communications. A primary advantage over other light sources is their high power output while a secondary advantage is that required optical elements for focussing the output of a linear phased array are less complex than elements required for focussing a non-phased array laser output because in the former case the beam is emitted as a narrow lobe.

Known linear arrays of semiconductor lasers are typically formed as stripe contact devices on a bar of double heterostructure material derived from the gallium aluminum arsenide/gallium arsenide (GaAlAs/GaAs) or the gallium indium arsenide phosphide/indium phosphide (GaInAsP/InP) systems. The stripe contacts usually extend equispaced and parallel to one another along the length of a double heterostructure bar, the bar usually having common p and n side contacts. As stripe spacing is reduced below about 20 microns the characteristic random phase relationship between emissions from the lasers changes to one in which adjacent lasers are in anti-phase. In a few cases, in-phase operation does result, but this is fortuitous and unusual. The anti-phase operation is completely contrary to the desired relationship for higher brightness in which all emissions are in-phase.

Various attempts have been made to solve this problem. In one proposal individual contacts are made to each laser whereby the injection current is tailored to that offering the nearest approximation to phased emission. In another modification, in-phase emission has been achieved by adopting an irregular stripe spacing. An alternative solution is now proposed.

SUMMARY OF THE INVENTION

According to one aspect of the invention, there is provided a semiconductor laser phase locked array having an output array and a control laser array, the output array having a plurality of equispaced optical gain elements, the control laser array having a plurality of equispaced diode lasers, the control array being mounted in laser coupling relationship with the output array with optical gain elements of the output array aligned with alternating lasers of the control laser array, the spacing of optical gain elements of the output array being twice the spacing of lasers of the control array, whereby the tendency of each laser in the control array to emit 180° out of phase with adjacent lasers ensures that alternate lasers are in-phase, and also ensures in-phase emission from the output array optical gain elements coupled thereto.

It may be noted that even if, fortuitously, the control array lasers operate with adjacent lasers in-phase, the optical gain elements of the output array will also be in-phase.

BRIEF DESCRIPTION OF THE DRAWING

An embodiment of the invention will now be described by way of example with reference to the accompany drawing showing a perspective view of a laser array according to the invention.

DETAILED DESCRIPTION OF THE PREFERRED EMBODIMENT

Referring in detail to the FIGURE there is shown a light emitting device having an output laser array 10 and a control laser array 12. The output laser array 10 has contact stripes 14 on the p or top side of the chip having spacing D. The control array has equispaced contact stripes 16 separated by D/2. Alternating ones of the control stripe 16 are aligned with the stripes 14 of the output laser array. The two parts 10 and 12 of the chip are separated by 5 microns and have a common n side or bottom contact 22 and respective p side contacts 21, 23. Typically, in use, adjacent lasers of the control array 12 emit in anti-phase, although occassionally, for some reason not fully understood, the lasers of the control array will in fact emit in-phase. Alternating lasers of the control array 12 are coupled with adjacent lasers of the output laser array 10 and so to ensure that the output lasers emit in-phase.

The laser arrays 10, 12 illustrated in the FIGURE have in vertically ascending order the following layers:

an n-type indium phosphide (InP) substrate 24 about 75 microns thick;

an n-type InP tin doped first confining layer 26 about 3 to 5 microns thick;

an n− or p− type $Ga_{1-x}In_xAs_{1-y}P_y$ tin or zinc doped active layer 28 about 0.1 to 0.3 microns thick;

a p-type InP zinc or cadmium doped second confining layer 30 of thickness 0.5 microns or less;

an n-type InP tin doped blocking layer 32 of a thickness about 1 to 1.3 microns thick; and an n-type $Ga_{0.47}In_{0.53}As$ capping layer 34 of thickness 0.5 microns.

For a GaAlAs/GaAs system, the composition and thickness of the layers may differ but their function is the same. Extending into the p side of the laser arrays are narrow p-type diffusions 36 which extend from the p side surface of the capping layer 34 through the capping and blocking layers 34 and 32 to merge with the p-type second confining layer 30. The bottom metal contact layer 22 extends over the n side of the entire substrate and the p side metal contacts 21, 23 are continuous along the length of the respective chip parts 10, 12 to cover the spaced diffuse regions 36. The p side metal contacts 21, 23 are 0.3–0.5 micron thick layers of chromium/gold alloy and the n side contact is a 0.5 micron thick layer of gold/germanium alloy. The laser arrays are bonded using a bonding material or an indium solder to a copper or diamond head sink 38. The laser emitting array 10 and the laser control array 12 are typically separated by 1 to 20 microns.

If it is desired to control the longitudinal modes of the coupled cavity (as in cleave-coupled-cavity lasers) it is necessary to ensure that the gap between the two arrays is less than the coherence length of the emitted radiation.

The control array typically has a laser cavity about 100 microns long with individual lasers defined by 2.5 microns wide zinc diffused stripes on 7.5 micron centers. The output array typically has a cavity length of 250 microns with the individual elements defined by 2.5 zinc diffused stripes on 15 micron centers.

In operation, and presuming for example, digital operation, the device is driven using a control circuit having a modulator 40 for controlling the output of the laser output array and a far field control monitor 42 for stabilizing the bias current applied to the lasers of the control array 12. The lasers of the output array 10 are biased to a position just below their lasing threshold and current is increased when the laser output section is to emit light pulses. A DC current is supplied above the threshold level to the lasers of the control array 12. Because the lasing cavities in the control array are close together, adjacent ones of the control lasers usually and naturally emit in anti-phase but drive the primary array lasers in-phase with each other. This technique allows the control array to operate in a nearly steady state to improve the output phase locking time.

In an alternative to the amplitude modulated system described, both the lasers of the control and output arrays 12, 10 are driven above threshold and the output wavelength of the output lasers is altered by changing the current either to the control or to the output lasers. A particular property of this device is that if the control array should happen to lock in-phase, the output array will still operate in-phase. This is especially important if the control element emits more than one longitudinal mode some in-phase and some in anti-phase.

The device of the FIGURE is fabricated as follows. Firstly the double heterostructure 26, 28, 30, the blocking layer 32, and the capping layer 34 are epitaxially grown on an InP substrate using, for example, liquid phase epitaxy or organometallic pyrolysis each of these techniques being well known in the art. The zinc or cadmium p-type diffusions 36 are produced through a mask (not shown) which spans the complete wafer. The contact layers 21, 22, 23 are then deposited by low pressure chemical vapour deposition. The wafer is then cleaved into bars, each bar consisting of the control and emission sections which are integral with one another. The two sections 10, 12 are then partially split from one another either by cleaving the bar longitudinally or by etching a channel through to the n side contact 22.

As indicated previously, the natural phase relationship between lasers of a linear array of the type shown is a random relationship with a stripe separation of 20 microns or more. This changes to an operating characteristic in which adjacent lasers are usually in anti-phase and occassionally in-phase when the stripe width drops below about 20 microns. In the examples shown in the FIGURE where the stripes of the control array are spaced apart in the order of 7 microns, the alternating phase characteristic will normally prevail for the control array 12 and consequent on that, the more widely spaced cavities in the emitting array 10 will emit in-phase.

Although the specifically described embodiment has lasers both in the control and output array it should be recognized that the output array need not be composed of semiconductor diode lasers but it is quite sufficient if the output array consists of a row of non-lasing optical gain elements.

In addition although the specific embodiment describes the use of stripe lasers in both the output and control arrays, the lasers or optical gain elements of the two parts of the array can instead be buried contact devices or indeed any of the known types of planar or non-planar monolithically integrated semiconductor lasers.

What is claimed is:

1. A semiconductor laser phase-locked array having an output array and a control laser array, the output array having a plurality of optical gain elements, the control laser array having a plurality of diode lasers, the control array being mounted in phase retaining relationship with the output array with optical gain elements of the output array coupled with alternating lasers of the control laser array, whereby the tendency of adjacent ones of the closely spaced lasers of the control array lasers to emit in anti-phase of each other ensures in-phase emission from the output array optical gain element coupled thereto.

2. A semiconductor laser phase-locked array as claimed in claim 1 in which the lasers of the control array and the optical gain elements of the output array both form linear arrays.

3. A semiconductor laser phase-locked array as claimed in claim 1 in which lasing cavities of the control array lasers have a center-to-center spacing of between 3 and 30 microns and the optical gain elements of the output array have a center-to-center spacing of between 6 to 60 microns.

4. A semiconductor laser phase-locked array as claimed in claim 1 in which the output array comprise a first double heterostructure having a plurality of stripe contact optical gain elements extending therealong, the optical gain elements having emitting facets at respective sides of the bar, the control laser array comprising a second double heterostructure bar having a plurality of stripe contact lasers spaced along the length thereof, the lasers of the control array having emitting facets at respective sides of the bar.

5. A semiconductor laser phase-locked array as claimed in claim 4 in which the two arrays are formed on a common substrate material, the substrate material being bonded to a heat sink.

6. A device as claimed in claim 5 in which at least one of the opposed facet surfaces has an anti-reflective coating thereon.

7. A semiconductor laser phase-locked array as claimed in claim 1 in which a common contact in electrical contact with the stripes of the control laser array extends the full length of the bar on which the control lasers are formed.

8. A semiconductor laser phase-locked array as claimed in claim 4 in which a common p side contact is in electrical contact with the stripes of the control laser array and extends the full length of the bar on which the control lasers are formed.

9. A semiconductor laser phase-locked array as claimed in claim 4, in which a common contact extends the full length of a bar on which the output array optical gain elements are formed and contacts all of the p side stripes of the lasers.

10. A semiconductor laser phase-locked array as claimed in claim 1, in which the optical gain elements are lasers.

* * * * *